(12) United States Patent
Hassemer et al.

(10) Patent No.: US 10,721,825 B2
(45) Date of Patent: Jul. 21, 2020

(54) BENT DISPLAY PANEL WITH ELECTRICAL LINES FOR A SENSOR

(71) Applicant: Google LLC, Mountain View, CA (US)

(72) Inventors: Brian Jon Hassemer, Gurnee, IL (US); Paul Lynn Fordham, Wauconda, IL (US); Mark Daniel Janninck, Glen Ellyn, IL (US); David Kyungtag Lim, Glenview, IL (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/681,042

(22) Filed: Aug. 18, 2017

(65) Prior Publication Data
US 2019/0059164 A1 Feb. 21, 2019

(51) Int. Cl.
| H05K 5/00 | (2006.01) |
| H05K 1/03 | (2006.01) |
| H05K 5/03 | (2006.01) |
| H05K 3/00 | (2006.01) |
| H05K 3/32 | (2006.01) |
| G06F 1/16 | (2006.01) |
| G06F 3/041 | (2006.01) |
| G06K 9/00 | (2006.01) |

(52) U.S. Cl.
CPC .......... *H05K 5/0017* (2013.01); *G06F 1/169* (2013.01); *G06F 1/1626* (2013.01); *G06F 1/1637* (2013.01); *H05K 1/0306* (2013.01); *H05K 1/0353* (2013.01); *H05K 3/0044* (2013.01); *H05K 3/32* (2013.01); *H05K 5/03* (2013.01); *G06F 3/041* (2013.01); *G06F 2203/0338* (2013.01); *G06F 2203/04103* (2013.01); *G06K 9/00013* (2013.01); *H05K 2201/10151* (2013.01)

(58) Field of Classification Search
CPC ...... H05K 5/0017; H05K 3/0044; H05K 5/03; H05K 3/32; G06K 9/00013; G06F 3/041; G06F 2203/04103
See application file for complete search history.

(56) References Cited

U.S. PATENT DOCUMENTS

| 5,384,690 A | 1/1995 | David et al. |
| 8,947,882 B2 * | 2/2015 | Kim .................... H04M 1/0277 361/728 |

(Continued)

FOREIGN PATENT DOCUMENTS

TW  I488086  6/2015

OTHER PUBLICATIONS

International Search Report and Written Opinion issued in International Application No. PCT/US2018029776, dated Jul. 12, 2018, 18 pages.

(Continued)

*Primary Examiner* — Nathan Milakovich
(74) *Attorney, Agent, or Firm* — Fish & Richardson P.C.

(57) ABSTRACT

An electronic device including a display panel is provided. In some embodiments, the display panel includes an active display region and an electrical component. The electrical component is distinct from a touch sensor device that is adapted to receive touch input across the active display region of the display panel. An electrical conductor connects the electrical component to another component of the electronic device via the display panel, such as via a bent portion of the display panel.

19 Claims, 5 Drawing Sheets

(56) References Cited

U.S. PATENT DOCUMENTS

| | | | |
|---|---|---|---|
| 9,460,332 B1 | 10/2016 | Bussat | |
| 10,088,865 B1* | 10/2018 | Li | G06F 1/1626 |
| 2006/0050492 A1 | 3/2006 | Goodwin et al. | |
| 2010/0062656 A1 | 3/2010 | Lynch et al. | |
| 2010/0091451 A1 | 4/2010 | Hendren et al. | |
| 2012/0044637 A1 | 2/2012 | Rothkopf et al. | |
| 2012/0242635 A1 | 9/2012 | Erhart | |
| 2013/0258575 A1 | 10/2013 | Rothkopf et al. | |
| 2013/0294047 A1* | 11/2013 | Moon | H04M 1/0277 362/23.03 |
| 2014/0042406 A1 | 2/2014 | Degner et al. | |
| 2014/0078692 A1 | 3/2014 | Park et al. | |
| 2014/0170907 A1 | 6/2014 | Golko et al. | |
| 2014/0184057 A1 | 7/2014 | Kim et al. | |
| 2014/0210675 A1* | 7/2014 | Hwang | H01Q 1/44 343/702 |
| 2014/0333858 A1* | 11/2014 | Martisauskas | G06F 1/1643 349/12 |
| 2015/0162392 A1 | 6/2015 | Yusok et al. | |
| 2015/0162684 A1 | 6/2015 | Amini et al. | |
| 2015/0382446 A1 | 12/2015 | Kwon et al. | |
| 2016/0004899 A1 | 1/2016 | Pi | |
| 2016/0029511 A1* | 1/2016 | Jung | F28F 23/00 361/700 |
| 2016/0079281 A1 | 3/2016 | Park et al. | |
| 2016/0079336 A1 | 3/2016 | Youn et al. | |
| 2016/0087024 A1 | 3/2016 | Son et al. | |
| 2016/0204183 A1 | 7/2016 | Tao et al. | |
| 2016/0204366 A1 | 7/2016 | Zhang et al. | |
| 2016/0216813 A1 | 7/2016 | Setlak | |
| 2016/0234362 A1* | 8/2016 | Moon | H04M 1/0202 |
| 2016/0234949 A1* | 8/2016 | Seo | H04M 1/0202 |
| 2016/0240605 A1 | 8/2016 | Lee | |
| 2016/0255182 A1* | 9/2016 | Lee | H04M 1/026 455/575.1 |
| 2016/0371529 A1 | 12/2016 | Bhagavat | |
| 2017/0062760 A1 | 3/2017 | Kim | |
| 2017/0205927 A1 | 7/2017 | Lee et al. | |
| 2017/0213068 A1* | 7/2017 | Chang | G06K 9/00053 |
| 2017/0243705 A1* | 8/2017 | Bae | H05K 1/189 |
| 2017/0287992 A1* | 10/2017 | Kwak | G06F 3/041 |
| 2017/0301266 A1* | 10/2017 | Zhang | H01L 51/0097 |
| 2017/0372114 A1* | 12/2017 | Cho | G01J 1/0219 |
| 2018/0017999 A1* | 1/2018 | Kim | G06F 1/1601 |
| 2018/0042127 A1* | 2/2018 | Kim | G06F 3/0412 |
| 2018/0160545 A1* | 6/2018 | Kim | G02F 1/1333 |
| 2018/0247143 A1* | 8/2018 | Cho | G06F 21/36 |
| 2018/0249584 A1* | 8/2018 | Kim | G06F 1/1656 |
| 2018/0249586 A1* | 8/2018 | Kim | B32B 27/36 |
| 2019/0012007 A1* | 1/2019 | Kim | G06F 3/02 |
| 2019/0037694 A1* | 1/2019 | Koo | H05K 1/118 |
| 2020/0021016 A1* | 1/2020 | Son | H05K 7/20963 |

OTHER PUBLICATIONS

'eandt.theiet.org' [online] "Huawei P9 smartphone: tech spec and teardown," Oct. 7, 2016, [retrieved on Feb. 3, 2017] Retrieved from Internet: URL<https://eandt.theiet.org/content/articles/2016/09/huawei-p9-smartphone-tech-spec-and-teardown/> 8 pages.

'www.androidauthority.com' [online] LG g4 Teardown, Jun. 8, 2015, [retrieved on Feb. 3, 2017] Retrieved from Internet: URL<http://www.androidauthority.com/lg-g4-teardown-614759/> 3 pages.

'www.chipworks.com' [online] "Inside the Samsung Galaxy S6," Apr. 2, 2015 [retrieved on Feb. 3, 2017] Retrieved from Internet URL<https://www.chipworks.com/about-chipworks/overview/blog/inside-the-samsung-galaxy-s6> 10 pages.

'www.fonearena.com' [online] "OnePlus 3 Teardown," [retrieved Feb. 3, 2017] Retrieved from Internet: URL<http://www.fonearena.com/blog/189275/oneplus-3-teardown.html> 14 pages.

'www.ifixit.com' [online] "Google Pixel XL Teardown," Oct. 21, 2016 [retrieved on Feb. 2, 2017] Retrieved from Internet: URL<https://www.ifixit.com/Teardown/Google+Pixel+XL+Teardown/71237> 14 pages.

'www.ifixit.com' [online] "iPhone 7 Plus Teardown," Sep. 15, 2016, [retrieved on Feb. 3, 2017] Retrieved from Internet: URL<https://www.ifixit.com/Teardown/iPhone+7+Plus+Teardown/67384> 30 pages.

'www.ifixit.com' [online] "Motorola Moto X Teardown," Aug. 23, 2013, [retrieved on Feb. 2, 2017] Retrieved from Internet URL<https://www.ifixit.com/Teardown/Motorola+Moto+X+Teardown/16867> 15 pages.

'www.ifixit.com' [online] Samsung Galaxy S7 Teardown, Mar. 8, 2016, [retrieved on Feb. 3, 2017] Retrieved from Internet: URL<https://www.ifixit.com/Teardown/Samsung+Galaxy+S7+Teardown/56686> 17 pages.

'www.padpcb.com' [online] "Flexible Printed Curcuit Manufacturing," 2017 [Retrieved on Feb. 3, 2017] Retrieved from Internet URL<http://www.padpcb.com/flexbile-printed-circuit-manufacturing_p41.html> 4 pages.

'www.szsmtfly.com' [online] "Temperature Resist Acf Tapes for Pulse Heat Bonding Machine LCD," 2016-2017 copyright, [retrieved on Feb. 3, 2017] Retrieved from Internet URL<http://www.szsmtfly.com/sale-8234891-temperature-resist-acf-tapes-for-pulse-heat-bonding-machine-lcd.html> 3 pages.

'www.techinsights.com' [online] "Apple iPhone 7 Teardown," Retrieved on Feb. 3, 2017} Retrieved from Internet: URLhttp://www.techinsights.com/about-techinsights/overview/blog/apple-iphone-7-teardown/> 24 pages.

TW Office Action in Taiwanese Appln. 107123027, dated Apr. 30, 2019, 17 pages.

PCT International Preliminary Report on Patentability in International Appln. No. PCT/US2018/029776, dated Feb. 27, 2020, 12 pages.

* cited by examiner

BENT DISPLAY PANEL WITH ELECTRICAL LINES FOR A SENSOR

BACKGROUND

Electronic devices sometimes include display devices and various types of sensors, such as proximity sensors or fingerprint sensors. Such display devices may include circuitry that is located on a circuit board housed within the interior of the electronic device. The circuitry may be configured to receive signals from one or more sensors included in the electronic device. In some electronic devices, electrical connections transfer data and/or power between sensors and processors or other components of the electronic device.

SUMMARY

In general, this document describes devices, systems, and methods for providing a display panel that includes electrical lines for an electrical component (such as a sensor), and in some optional embodiments, a display panel having a bent portion that facilitates connection between the display panel and one or more component. A display panel (e.g., an OLED layer of a display device) that is bent so that its edge faces a different direction than another edge or a primary plane of the display device may route electrical lines along the bent portion. These electrical lines may connect a circuit board within an interior of an electronic device to an electrical component that may not typically communicate via electrical lines that run through a display (such as a fingerprint sensor or a proximity sensor). The presence of the electrical lines may allow the electrical component to be mounted to a front or back face of the display panel, such that the display panel may extend close or all the way to an edge of the electronic device (whereas the display panel would typically otherwise extend less close to the edge of the electronic device, to provide space for the electrical component). The bend in the display panel may route the electrical lines from the location of the electrical component to a back side of the display panel, where the electrical lines may connect to a removably attachable flex connector. The flex connector may complete the connection between the electrical component and circuitry that is located on the back side of the display panel.

In some embodiments, the display panel includes a portion that is co-planar with an active display region of the display panel, but that may not be part of the active display region of the display panel. This extended portion of the display panel may form at least part of an edge of the display panel, and the electrical component may be located at least partially on this extension portion. As such, the extension portion may form a location at which the electrical component is able to connect to electrical lines that are integrated within or on the display panel. In some embodiments, the extension portion may bend (e.g., 180°) such that the extension portion bends back behind a region of the display panel to connect with the above-described flex connector. Various combinations of the design features described throughout this disclosure may allow a reduction in the overall dimensions of the electronic device while maintaining the same size display, or may enable the display to increase while maintaining the same overall dimensions of the electronic device.

As additional description to the embodiments described below, the present disclosure describes the following embodiments.

Embodiment 1 is an electronic assembly, comprising: a display panel that includes: a front major face, a back major face that opposes the front major face, an active display region of the front major face, and a bent portion; a touch sensor device, the touch sensor adapted to receive touch input across the active display region of the display panel; a sensor connected to the display panel, the sensor being distinct from the touch sensor device; a circuit board that includes a processor, the circuit board positioned behind the back major face of the display panel; a first electrical conductor positioned behind the back major face of the display panel and that electrically connects the bent portion of the display panel to the circuit board; and a second electrical conductor that connects the sensor to the first electrical conductor via the bent portion of the display panel.

Embodiment 2 is the electronic assembly of embodiment 1, wherein the sensor comprises a fingerprint sensor.

Embodiment 3 is the electronic assembly of any of the preceding embodiments, wherein the sensor comprises a proximity sensor.

Embodiment 4, is the electronic assembly of any of the preceding embodiments, further comprising a cover glass that covers the display panel and the sensor.

Embodiment 5, is the electronic assembly of any of the preceding embodiments, further comprising a port configured to removably receive an external connector, wherein: the external connector is to supply data or power from an external device, and the sensor is positioned between the port and a cover glass of the electronic assembly.

Embodiment 6 is the electronic assembly of any of the preceding embodiments, wherein the port includes a USB port.

Embodiment 7 is the electronic assembly of any of the preceding embodiments, wherein the bent portion comprises a first bent portion and a second bent portion, the first bent portion and the second bent portion being separately bendable.

Embodiment 8 is the electronic assembly of any of the preceding embodiments, wherein: the display panel includes an extension portion, the extension portion is located between the first bent portion and the second bent portion, and the sensor is connected to the extension portion of the display panel.

Embodiment 9 is the electronic assembly of any of the preceding embodiments, wherein the display panel defines a central, longitudinal axis that is parallel to the front and back major faces, and the extension portion of the display panel is centered about the central, longitudinal axis.

Embodiment 10 is the electronic assembly of any of the preceding embodiments, wherein: the display panel defines a central, longitudinal axis that is parallel to the front and back major faces, the bent portion comprises a first bent portion and a second bent portion, and the first bent portion is on an opposite side of the central, longitudinal axis from the second bent portion.

Embodiment 11 is the electronic assembly of any of the preceding embodiments, wherein the display panel comprises a polyamide substrate having a plurality of electrical signal lines.

Embodiment 12 is the electronic assembly of any of the preceding embodiments, wherein the display panel comprises a glass substrate comprising a plurality of electrical signal lines.

Embodiment 13 is the electronic assembly of embodiment 1, wherein: the display panel includes an extension portion of the display panel, the sensor connects to the extension portion of the display panel, and the extension portion extends a greater distance from the active display region as compared to the bent portion.

Embodiment 14 is the electronic assembly of embodiment 1, wherein: the display panel comprises an extension portion that extends beyond the active display region of the front major face, and the sensor is connected to a portion of the back major face that extends onto the extension portion of the display panel such that the sensor is positioned behind the back major face of the display panel.

Embodiment 15 is an electronic assembly, comprising: a display panel that includes: a front major face, a back major face that opposes the front major face, an active display region of the front major face, and a bent portion; a touch sensor device, the touch sensor adapted to receive touch input across the active display region of the display panel; a sensor connected to the display panel, the sensor being distinct from the touch sensor device; and an electrical conductor that comprises a conductive line in contact with the display panel through at least some of the bent portion of the display panel.

Embodiment 16 is the electronic assembly of embodiment 15, wherein the extension portion extends a greater distance from the active display region as compared to the bent portion.

Embodiment 17 is the electronic assembly of embodiments 15 or 16, wherein the bent portion comprises a first bent portion and a second bent portion, the first bent portion and the second bent portion being separately bendable, and an extension portion located between the first bent portion and the second bent portion.

Embodiment 18 is the electronic assembly of any of embodiments 15-17, further comprising a port configured to removably receive an external connector, wherein: the external connector is configured to supply data or power from an external device.

Embodiment 19 is a method of manufacturing an electronic assembly, comprising: routing electrical conductors through a display panel substrate; cutting the display panel substrate; and bending less than an entire side of the display panel substrate to form a bent portion and an extension portion.

Embodiment 20 is the method of embodiment 19, further comprising connecting a fingerprint sensor to the display panel substrate to place the fingerprint sensor in electrical communication with the electrical conductors through the display panel substrate.

These and other embodiments described herein may provide one or more of the following benefits. First, some configurations described herein allow an electronic device to be relatively smaller in size. A display panel having bent portions (e.g., that facilitate connection between the display panel and a flex conductor behind an active display region of the display panel) further allows an active display region of the display panel to occupy a greater portion of the front area of the electronic device. Such a configuration can promote a desirable visual aesthetic by reducing the area of a bezel or border around the active display region of the display, increasing the visible area of the display without increasing the overall dimensions of the electronic device, or reducing the overall dimensions of the electronic device without reducing the visible area of the display panel. A larger display panel may also be capable of recognizing touch inputs that otherwise would have inadvertently occurred outside the sensing boundary of the display panel (e.g., at a bezel region of the electronic device).

Second, some configurations described herein accommodate a sensor in a space efficient manner. For example, a sensor located on the display panel facilitates electrical communication with a circuit board through electrical connections of the display panel without substantially increasing the overall dimensions of the electronic device, or by decreasing the overall dimensions of the electronic device.

Third, some configurations described herein can promote robust antenna operation. For example, a sensor, such as a fingerprint sensor on the display panel, can be located over a port (e.g., a USB port), and/or between a display panel and a sidewall of an electronic device housing, without providing significant interference to antennas located near the port.

Fourth, some configurations described herein can facilitate robust and efficient manufacturing processes by reducing assembly gaps and/or by reducing tolerance loops that may otherwise may be used for adhesive and/or other sealing mechanisms. For example, a sensor located directly on a portion of the display panel can be readily positioned with respect to other components of the display assembly and can be connected to a circuit board by electrical conductors through the display panel. In some example embodiments, such assembly techniques can promote a reduced border (e.g., a reduced area between an active display region of the display and an outer overall dimension of the electronic device). In some example embodiments, such assembly techniques can reduce a number of components of an electronic device.

The details of one or more embodiments are set forth in the accompanying drawings and the description below. Other features and advantages will be apparent from the description and drawings, and from the claims.

DESCRIPTION OF THE DRAWINGS

The details of one or more embodiments are set forth in the accompanying drawings and the description below, and wherein.

DETAILED DESCRIPTION OF ILLUSTRATIVE EMBODIMENTS

Figure 1:
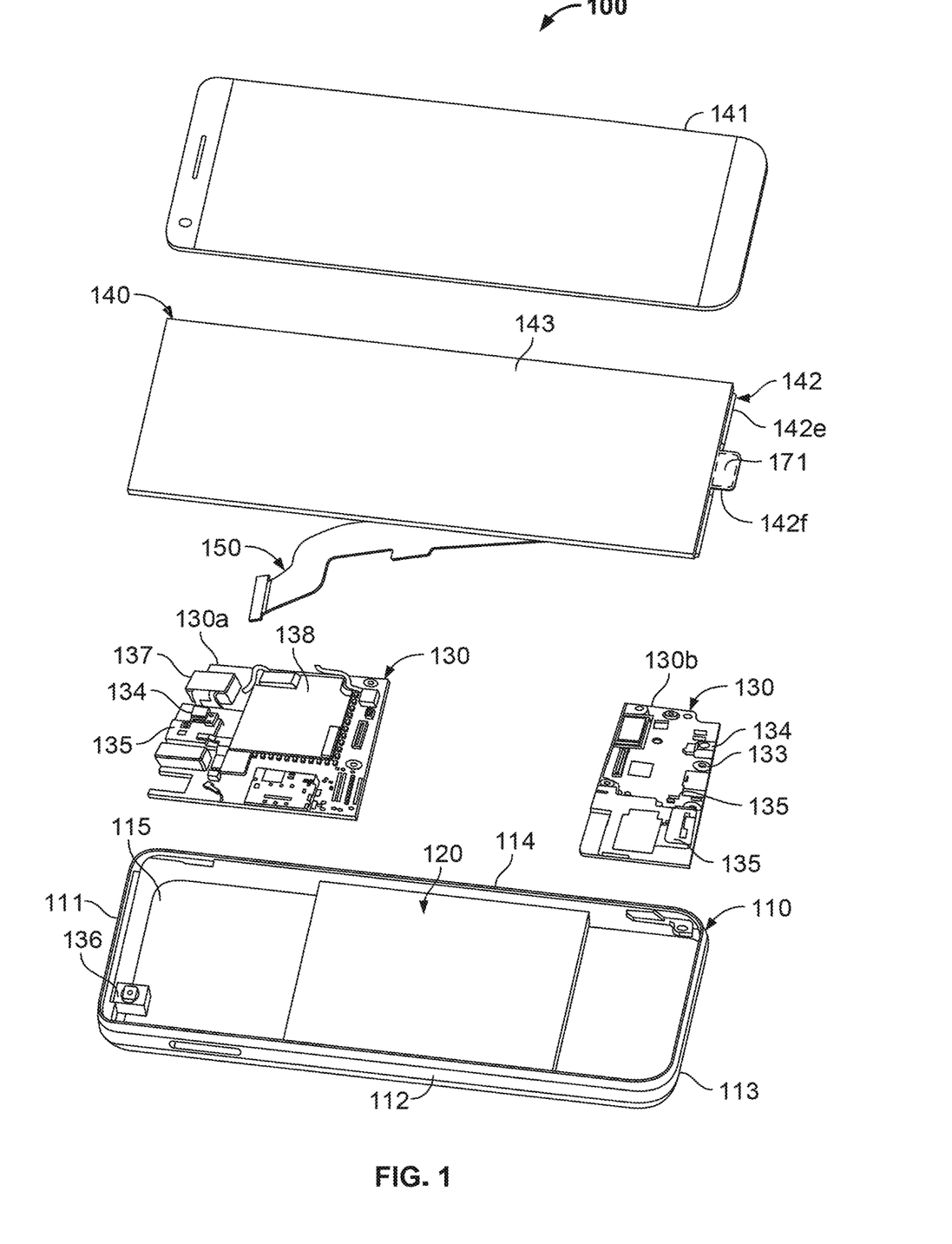
FIG. 1 is a perspective exploded view of an electronic device having a sensor on the display panel.

Referring to FIG. 1, an example electronic device 100 is shown, including an electronic device housing 110, battery 120, circuit board 130, and a display assembly 140. A flex conductor 150 electrically connects display assembly 140 with circuit board 130 to provide transfer of data and power between display assembly 140 and circuit board 130. A sensor 171 is located on display assembly 140. Display assembly 140, flex conductor 150, sensor 171, and the connections between circuit board 130, display assembly 140, and flex conductor 150, may be configured to reduce the amount of space required to accommodate these components within electronic device 100, and facilitate flexibility in the arrangement of other components within electronic device 100.

Electronic device housing 110 and an outer cover 141 define an interior volume that can house one or more components of electronic device 110, including battery 120, circuit board 130, and display assembly 140. Housing 110 can accommodate additional components of electronic device 100, such as microphone 133, speaker 134, sensors 135, such as fingerprint sensors, proximity sensors, accelerometers, and/or other sensors, camera assembly 136, flash devices 137, processor 138, and/or other components. In various embodiments, some or all of these components are electrically connected with circuit board 130.

Electronic device housing 110 provides a bucket-type enclosure having first, second, third, and fourth side portions 111, 112, 113, 114 that define outer sidewalls of electronic device 100, and a back major planar face 115 integrally formed with side portions 111, 112, 113, 114. A bucket-type enclosure allows components of electronic device 100 to be accommodated within housing 110 and enclosed by an outer cover, such as outer cover 141. In other embodiments, one or more side portions and/or back major planar face 115 may be formed separately and subsequently joined together (e.g., with one or more adhesives, welds, snap-fit connectors, fasteners, etc.). In various embodiments, electronic device housing 110 may be an H-beam type housing or other electronic device housing 110 that includes one or more walls that provide a housing to at least partially support and/or enclose components of electronic device 100.

Electronic device housing 110 is made from a material that provides adequate structural rigidity to support and protect internal components of electronic device 100. In an example embodiment, electronic device housing 110 is formed from a single piece of metal. Electronic device housing 110 may be milled, molded, forged, etched, printed, or otherwise formed. Alternatively or additionally, electronic device housing 110 may be formed from plastic, glass, wood, carbon fiber, ceramic, combinations thereof, and/or other materials.

Circuit board 130 is configured to accommodate components of electronic device 100 in a space-efficient manner, and provide robust mechanical and electrical connections between these components, such as one or more of microphone 133, speaker 134, sensors 135, camera assembly 136, flash devices 137, processor 138, and/or other components. In some embodiments, circuit board 130 includes a top circuit board 130*a*, and a bottom circuit board 130*b*, arranged at respective top and bottom end regions of electronic device 100, for example. Top and bottom circuit boards 130*a*, 130*b* are separately formed circuit boards and may be electrically connected by an electrical conductor. In other embodiments, top and bottom circuit boards 130*a*, 130*b* are integrally formed as a unitary circuit board (e.g., joined by a third circuit board extending between top and bottom circuit boards 130*a*, 130*b*).

Battery 120 may be positioned adjacent to top and/or bottom circuit boards 130*a*, 130*b* such that battery 120 is positioned substantially centrally between a top and bottom of electronic device 100 (e.g., between top and bottom sidewalls 111, 113). In other embodiments, battery 120 may be positioned in a stacked configuration such that circuit boards 130*a* and/or 130*b* are between battery 120 and display assembly 140 (e.g., sandwiched between battery 120 and display assembly 140), or vice versa. In some example embodiments, one or more electrical conductors may extend through battery 120 to allow electrical communication between top circuit board 130*a* and bottom circuit board 130*b* via battery 120.

Battery 120 provides a primary source of power for electronic device 100 and its components. Battery 120 may include a secondary cell, rechargeable battery configured for use through thousands of battery charging cycles over the entire useful life of electronic device 100, for example. In various embodiments, battery 120 may be a lithium polymer battery, lithium ion battery, nickel metal hydride battery, nickel cadmium battery, or other battery type configured to power electronic device 100 over many charging cycles. Alternatively or additionally, battery 120 may include a primary cell battery configured to be replaced when substantially discharged.

Display assembly 140 provides a user interface display that displays information to a user. For example, display assembly 140 may provide a touch screen display that a user can interact with to view displayed information and to provide input to electronic device 100. In an example embodiment, display assembly 140 occupies substantially all or the majority of a front major face of electronic device 100, and includes a visible display (e.g., a rectangular visible display having curved surfaces near the perimeter edges).

Display assembly 140 may include one or more substrate layers that provide the visible display and/or allow display assembly 140 to receive touch input from a user. For example, outer cover 141 may serve as an outermost layer that encloses other components of display assembly 140 and electronic device 100 and that a user may physically touch to provide input to electronic device 100. A touch sensor device such as a resistive touchscreen panel, a surface acoustic wave device, or a capacitive touchscreen panel may receive the touch input and provide an indication of such touch input to a processor of the device. The touch sensor device may be adapted to receive touch input across the active display region of the display panel (e.g., at least the majority of the front face of the electronic device) to select user interface elements that are displayed by the display assembly. As such, the sensor 171 may be distinct from the touch sensor device and is not be one of multiple sensors in an array that together may form the touch sensor device. Rather, the sensor 171 may provide a different function and may use different sensing technology than the touch sensor device (e.g., infrared vs capacitive).

Display assembly 140 includes a display panel 142, such as a liquid crystal display (LCD) panel including a liquid crystal material positioned between one or more color filter and thin-film-transistor (TFT) layers. The layers of display panel 142 may include substrates formed from glass or polymer, such as polyamide, polyethylene terephthalate, polyethylene naphthalate, etc. In various embodiments, display assembly 140 may include a light-emitting diode (LED) display panel 142, an organic light-emitting diode (OLED) display panel 142, such as an active-matrix organic light-emitting diode (AMOLED) display, a plasma display panel 142, an electronic ink display panel 142, or other display panel that provides visual output to a user. In some example embodiments, display assembly 140 includes a polarizer 143 located above the display panel 142.

Display assembly 140 may include driver circuitry used to control display output and/or receive user input. In some embodiments, driver circuitry includes a display integrated circuit that is mounted in electrical communication with the TFT layers of display panel 142, for example by gate lines or other electrical connection. The display integrated circuit may receive display data from processor 138, for example, and deliver corresponding signals to control the optical properties of a liquid crystal layer, for example, to produce a display output. The display integrated circuit may be located on the display panel, the flex conductor 150, and/or another component of electronic device 100. For example, the display integrated circuit may be positioned at a bottom of display panel 142 (e.g., a bottom portion of display panel 142 close to bottom wall 113), at a top of display panel 142 (e.g., a portion of display substrate 142 close to top wall 111), along a side of display panel 142 (e.g., a side portion of display substrate 142 close to sidewall 112 or sidewall 114), on a flex conductor 150, etc.

Connection between the display integrated circuit and circuit board 130 (and particularly processor 138, for example) may be provided by an electrical conductor that facilitates a robust electrical connection while maintaining a space-efficient and low profile configuration that does not significantly increase the overall dimensions of electronic device 100. In an example embodiment, flex conductor 150 connects the display integrated circuit and circuit board 130. Flex conductor 150 includes conductive structures on a thin, flexible substrate. Flex conductor 150 has a relatively thin profile and may be bent along a longitudinal direction to fit between components of electronic device 100, such as to connect from a front face of a display substrate to circuit board 130 by passing between battery 120 and a rear of display assembly 140. Conductive structures of flex conductor 150 may include conductive lines, printed conductive traces, or other conductive components that provide electrical connection between respective electrical contacts associated with display integrated circuit 145 and circuit board 130. Flex conductor 150 may be a single, double, or multi-layer flexible printed circuit including a polyamide, PEEK, polyester, etc., having printed or laminated conductive elements, for example. Such construction provides robust electrical characteristics that can provide reliable connection between various components while having a low bending radius that facilitates compact arrangement of flex conductor 150 within electronic device 100.

Components of display assembly 140, flex conductor 150, and sensor 171 may be positioned within electronic device 100 such that a border region (e.g., a region that does not provide a visible display), and/or the space required to connect display assembly 140 with circuit board 130, is reduced. In some embodiments, display panel 142 includes a bent portion 142e that bends towards a location behind the back major face of display panel 142. The display panel may connect with flex conductor 150 at a location behind an active display region of display panel 142 (e.g., located adjacent to a rear major surface of the display panel, such as directly behind the second major surface or separated by one or more components) instead of a flex conductor wrapping around to connect with display panel 142 at the end or proximate a top major face of display panel 142, for example. Bent portion 142e may reduce the extent of non-display region 142b visible to a user by locating a portion of non-display region 142b away from a front of electronic device 100, such as behind other portions of display assembly 142 and/or along a thickness (e.g., in the z-direction) of electronic device 100.

In some embodiments, bent portion 142e does not extend along an entire width of a bottom edge of display panel 142. For example, an extension portion 142f may extend outwardly beyond the bent portion 142e. Sensor 171 may be located on extension portion 142f and may electrically connect to flex conductor 150 via electrical conductors of display panel 142. Extension portion 142f facilitates positioning of sensor 171 in a space-efficient manner accessible to a user of electronic device 100. In an example embodiment, bent portion 142e is spaced from a wall of electronic device housing 110, such as bottom sidewall 113 a relatively-greater distance than extension portion 142f. One or more components, such as antenna components, may be accommodated in the space between bent portion 142e and bottom sidewall 113. Extension portion 142f may facilitate positioning of sensor 171 and/or additional components, such as an antenna, and/or bent portion 142e may simultaneously facilitate a reduced border region where a display is not visible during operation of electronic device 100. In some embodiments, display panel 142 may include an extension portion 142f and not include a bent portion 142(e) (e.g., such as a display panel 142 that includes a glass layer or other material having relatively low flexibility).

Electronic device 100 may be an electronic device including a display assembly, such as a mobile phone, music player, tablet, laptop computing device, wearable electronic device, data storage device, display device, adapter device, desktop computer, or other electronic device.

Figure 2:
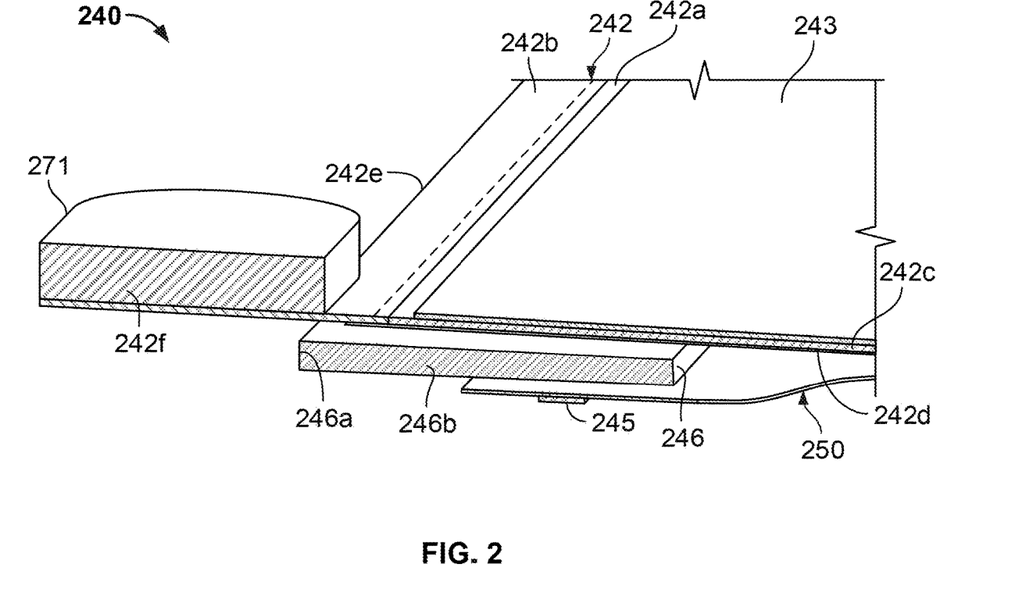
FIG. 2 is a cross-sectional perspective view of a display assembly.
Figure 3:
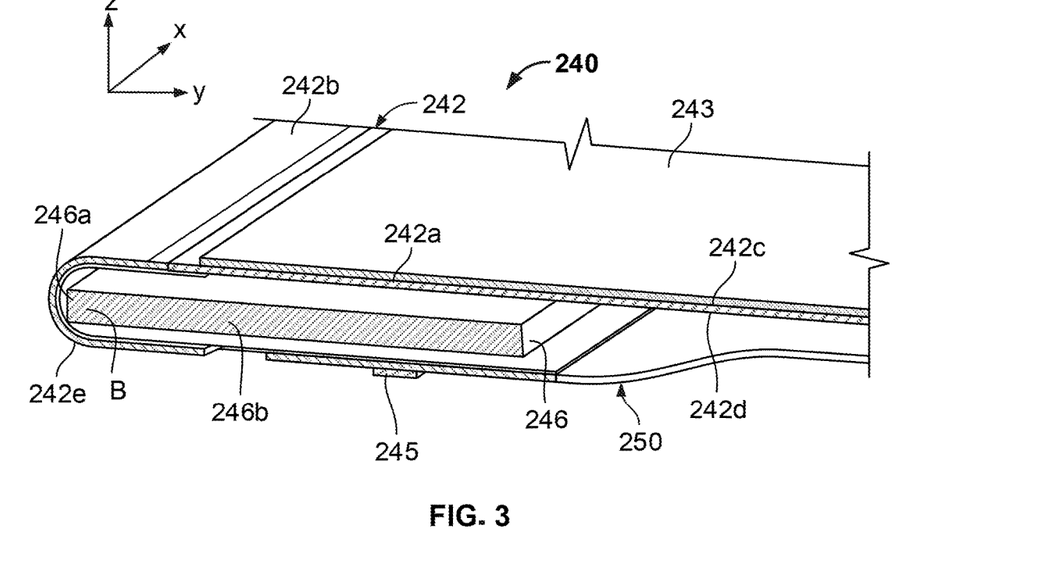
FIG. 3 is a cross-sectional perspective view of the display assembly of FIG. 2 at a location spaced from a display extension portion.
Figure 4:
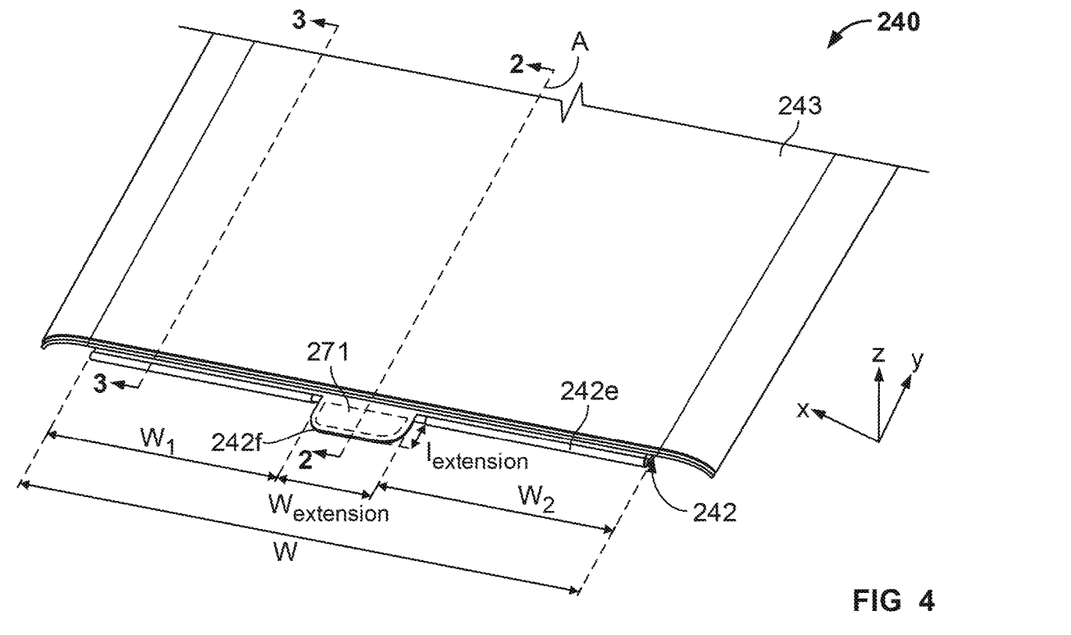
FIG. 4 is a partial front perspective view of the display assembly of FIG. 2.

Referring to FIGS. 2-4, an example display assembly 240 is shown. Display assembly 240 provides a display output and/or touch input for electronic device 200, and, in some embodiments, may have features similar to display assembly 140 described above with reference to electronic device 100. Display assembly 240 includes one or more layers, including a display panel 242 and substrate 243. A flex conductor 250 is configured to electrically connect display assembly 240 with a circuit board (e.g., similar to circuit board 130, described above) or other component of electronic device 200.

Display panel 242 includes an active display region 242a and a non-display region 242b. The non-display region 242b is an area that does not display output visible to a user during operation. Display panel 242 includes a front major surface 242c and a back major surface 242d. The front and back major surfaces 242c, 242d each include portions of active display region 242a and non-display region 242b. Display panel 242 may be an LCD, LED, OLED, AMOLED, plasma, electronic ink, or other display panel. In some embodiments, display panel may include a color filter layer, a TFT layer, and/or an encapsulation layer. A liquid crystal material may be positioned between the color filter layer and TFT layer. The active display region 242a of display panel 242 includes an array of display pixels configured to generate a visible display, and the non-display region 242b at least partially surrounds active display region 242 at edges of display panel 242. In some embodiments, the display pixels may be associated with driving thin-film-transistors and switching thin-film-transistors of the TFT layer. In some embodiments, gate and data drivers are located in non-display region 242b. In some embodiments, the non-display region 242b may share the same substrate as the display region 242a and electrical lines may pass between the non-display region 242b and the display region 242a.

Display integrated circuit 245 is electrically connected to display panel 242. In some embodiments, display integrated circuit 245 may be mounted to, and electrically connected with, display panel 242 at the non-display region 242b (e.g., in a chip-on-glass configuration). In some example embodiments, display integrated circuit 245 may be mounted to, and electrically connected with, flex conductor 250 (e.g., in a chip-on-flex configuration).

Substrate 243 of display assembly 240 may be a cover layer located over active display region 242a and/or non-display region 242b. For example, substrate 243 may include a color filter, polarizer, protective layer, or other substrate at least partially covering display panel 242. In some embodiments, display substrate 243 covers the entire active display region 242a of display panel 242.

Display assembly 240 may include one or more components that facilitate manufacturing and/or promote a robust display assembly 240 suitable for installation in an electronic device. For example, display assembly 240 may optionally include one or more support substrates, such as a first support substrate, second support substrate, and/or third support substrate, and one or more adhesive layers. A first support substrate may be a back plate to which back major surface 242d of display panel 242 is attached (e.g., OLED layers of display panel 242). A second support substrate may be a rigid support member that is relatively thicker than the first support substrate, and may be a mandrel 246. The second support substrate 246 provides support for components of display assembly 240. In some embodiments, second support substrate 246 includes a rounded end 246a and an elongated body portion 246b. One or more components of display panel 242 may be bent around rounded end 246a of second support substrate 246 to connect with a component located behind second major surface 242d of display panel 242 (e.g. located adjacent to the second major surface of display panel 242d, such as directly behind the second major surface or separated by one or more components). The first support substrate may be adhesively attached to the second support substrate by an adhesive, such as a pressure sensitive adhesive.

A third support substrate may provide a back plate that may at least partially support display panel 242 (e.g., a bent portion of display panel 242 behind active display region 242a) and/or flex conductor 250. For example, display panel 242 may be attached to the third support substrate at the back major surface 242d. In some embodiments, the third support substrate is attached to the second support substrate 246 by an adhesive, such as a pressure sensitive adhesive.

The support substrates and/or adhesives may facilitate assembly of multiple layers of display assembly 240. The first support substrate, second support substrate, and/or third support substrate provide rigidity that may promote precise location of display panel 242 and other components of display assembly 240 relative to one another and to other components of an electronic device that display assembly 240 is located within.

Referring to FIG. 2, display panel 242 includes a bent portion 242e that exhibits a curvature (e.g., a bent portion of non-display region 242b) and an extension portion 242f. Bent portion 242e includes a portion of display panel 242 that curves out of a plane of a portion of active display region 242a such that the bent portion 242e is not co-planar with at least a portion of active display region 242a (e.g., at least 50%, 70%, 90%, or 95% of the active display region 242a). In some example embodiments, bent portion 242e forms a bend of about 180° such that an end of bent portion 242e extends around one or more components of display assembly 240, and/or the end is located behind one or more components of display assembly 240. In some embodiments, the bent portion is adhered or otherwise fastened to the one or more components around which it bends. In various example embodiments, bent portion 242e bends about an angle (e.g., between the end of the bent portion and a portion coplanar with active display region 242a) between about 60° and 210°, 90° and 195°, or 175° and 185°.

Display assembly 240 includes a sensor 271 located on extension portion 242f. Extension portion 242f may be a portion of display panel 242 extending outwardly beyond bent portion 242e. For example, extension portion 242f may extend outwardly in a direction co-planar (e.g., substantially coplanar, within 10° of exactly coplanar) to a portion of active display region 242a of display panel 242. Extension portion 242f provides a substrate that can support sensor 271 (e.g., either direction or through one or more intermediate layers or components that fixedly connect the sensor 271 to the extension portion 242f). Alternatively or additionally, extension portion 242f includes electrical conductors that facilitate electrical communication between sensor 271 and one or more components, such as flex conductor 250 in electrical communication with a circuit board of an electronic device. For example, the electrical conductors that provide electrical communication between sensor 271 and a circuit board of electronic device are routed through display panel 242, such as the TFT layer, a polyamide substrate layer, or a layer having touch sensing capability. In some embodiments, the electronic device does not include additional electrical conductors (e.g., external to display panel 242) used to provide communication between sensor 271 and flex conductor 250 or other component of the electronic device. The display panel 242 may provide the exclusive electrical communication between sensor 271 and flex conductor 250 or another component of electronic device 200.

In some embodiments, an anisotropic conductive adhesive (ACA), such as an anisotropic conductive film and/or anisotropic conductive paste, may connect sensor 271 to display panel 242 (e.g., extension portion 242f of display panel 242). The ACA facilitates electrical connection between sensor 271 and lines routed through display panel 242f. Alternatively or additionally, an ACA bond may be present between the electrical lines of display panel 252 and a flex conductor, for example.

Bent portion 242e and extension portion 242f of display panel 242 may be integrally formed as portions of a unitary display panel 242. For example, display panel 242 may be formed from a sheet of substrate material and subsequently cut and formed, such as by bending a portion to form bent portions 242e, while another portion is not bent to provide extension portion 242 coplanar with a portion of active display region 242e. In some embodiments, sensor 271 located on extension 242f is in direct contact and electrical communication with display panel 242 (e.g., non-display region 242b), and may reduce additional components and/or connections that otherwise may be required for electrical connection between sensor 271 and a circuit board of electronic device 200.

Sensor 271 may be a fingerprint sensor configured to receive input from a user of the electronic device 200. Alternatively or additionally, sensor 271 may include a proximity sensor, imager sensor configured to capture an image (e.g. as part of a camera system), or other sensors.

Referring to FIG. 4, a partial front perspective view of display assembly 240 is shown. In an example embodiment, extension portion 242f extends outwardly (e.g., in the y-direction) from other portions of display panel 242. Extension portion 242f forms a tab or support substrate that sensor 271 is located on. Extension portion 242f may be configured to have a shape, position, and dimensions to accommodate sensor 271 in a space-efficient manner. For example, extension portion 242f extends outwardly beyond bent portion 242e a length ($l_{extension}$) and has a width ($w_{extension}$). Length ($l_{extension}$) and width ($w_{extension}$) provide a surface area sufficient to at least partially accommodate sensor 271. In an example embodiment, the length ($l_{extension}$) is relatively smaller than the width ($w_{extension}$). Such relative dimensions may facilitate an area large enough to accommodate sensor 271, while reducing the overall dimensions of display assembly 240 and an electronic device that includes display assembly 240. In various examples, length ($l_{extension}$) is between about 2 mm and 25 mm, 4 mm and 10 mm, or about 5 mm, and width ($w_{extension}$) is between about 4 mm and 40 mm, 6 mm and 20 mm, or about 12 mm. Such dimensions may promote a space efficient configuration, and/or facilitate location of extension portion 242f above another component of electronic device 200, such as a connector port (e.g. a USB port).

Bent portion 242e includes first and second bent portions 242e having a first width (w1) and a second width (w2). First and second widths (w1), (w2), may be selected to accommodate the desired number, size, and arrangement of electrical conductors, gate and data drivers, or other components of display panel 242, display assembly 240, or the electronic device display assembly 240 is housed within, and to accommodate extension portion 242f. In some embodiments, first and second widths (w1), (w2) are substantially identical and may be located symmetrically about a central, longitudinal axis (A). For example, central, longitudinal axis (A) passes through extension portion 242f. Bent portions 242e having first and second widths (w1), (w2) are located symmetrically on each side of central, longitudinal axis (A) and extension portion 242e. Alternatively, first and second widths (w1), (w2) may be different. For example, first width (w1) may be wider and/or accommodate more or different electrical conductors as compared to second width (w2). In some example embodiments, bent portion 242e is present only to one side of extension portion 242e, and/or extension portion 242f may be offset from the central, longitudinal axis (A) such that the central, longitudinal axis (A) does not intersect extension portion 242f In various example embodiments, bent portion 242e may include three or more bent portion having the same or different widths (w). In some implementations, bent portion 242e may be located to a different side of the display assembly than a location of the sensor (e.g., on an opposite side or adjacent side).

In an example embodiment, bent portion 242e and extension portion 242f do not overlap along the width (W) of display assembly 240. For example, only bent portion 242e is present along a first, left region of the bottom edge of display assembly 240, only extension portion 242f is present along a second, central region of the bottom edge of display assembly 240, and only bent portion 242e is present along a second, right region of the bottom edge of display panel 242. In some embodiments a distance separating first and second widths (w1), (w2) of bent portions 242e may be equal to the width ($w_{extension}$) of extension portion 242f. The first and second widths (w1), (w2), and width ($w_{extension}$) of extension portion 242f may be equal to the width (W) of display panel 242.

Bent portion 242e may bend about an axis such that an end of bent portion 242e is located behind another portion of display panel 242. In an example embodiment, bent portion 242e is bent about a bend axis (B) parallel to the x-axis, and configured to be positioned proximate a bottom wall of an electronic device housing, such as bottom sidewall 113 of electronic device housing 110. Alternatively or additionally, bent portion 242e may be configured to be positioned proximate a top wall of an electronic device housing, such as top sidewall 111 of electronic device housing 110. In some embodiments, display panel 242 may include one or more bent portions 242e bent around a bend axis parallel to the y-axis and configured to be positioned proximate sidewalls of an electronic device housing, such as left and right sidewalls 112, 114 of electronic device housing 110. Bent portions 242e located proximate sidewalls of an electronic device housing can promote a reduced non-display area proximate respective sidewalls of an electronic device while accommodating one or more sensors or additional components in a space-efficient manner.

In some embodiments, display panel 242, including bent portion 242e, may bend about two or more axes. For example, bent portion 242e may bend about an x-axis in order to bend behind another portion of display assembly, and may bend about a y-axis near sides of display panel 242 (e.g., where the active display region 242a is curved near edge regions of display panel 242).

Figure 5:
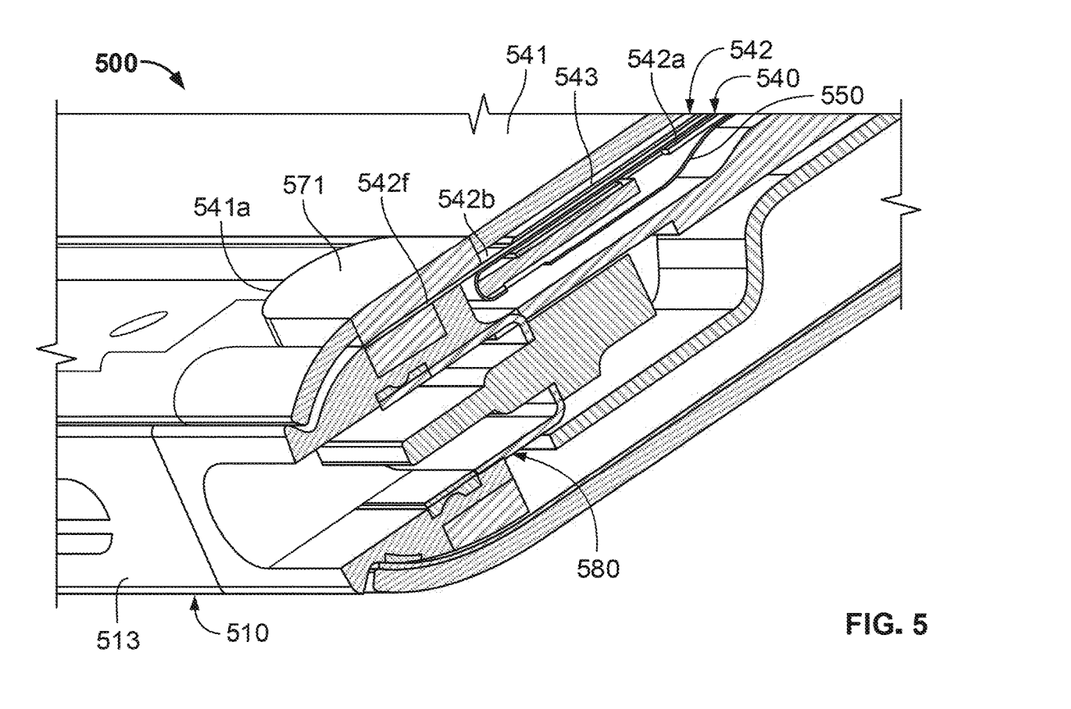
FIG. 5 is a cross-sectional perspective view of an electronic device including an example display assembly.
Figure 6:
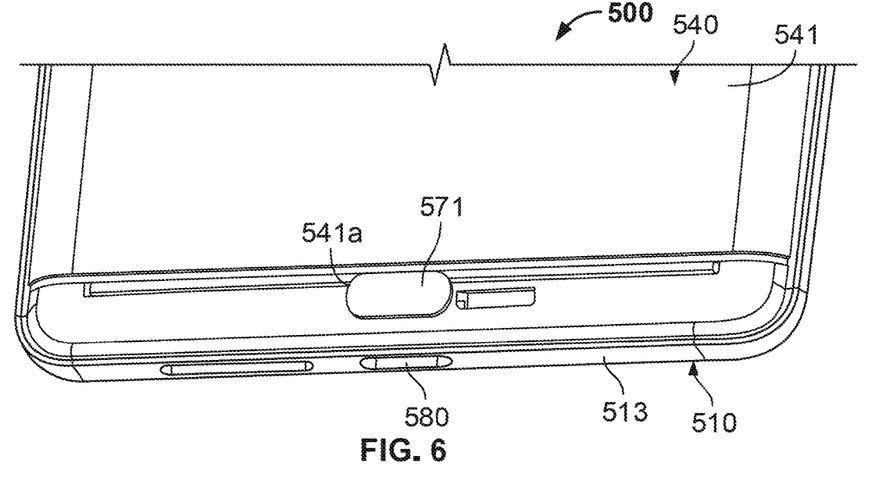
FIG. 6 is a partial front perspective view of the display assembly of FIG. 5.

Referring to FIGS. 5 and 6, an example electronic device 500 including display assembly 540 is shown. Display assembly 540 provides a display output and/or touch input for electronic device 500, and, in some embodiments, may have features similar to display assembly 140 and/or display assembly 240 described above with reference to electronic device 100 and electronic device 200, respectively. Display assembly 540 provides a space-efficient display that may reduce the presence of non-display border regions, and/or include electrical conductors that may connect a circuit board within an interior of electronic device 500 with a sensor, such as sensor 571, that may not typically communicate via a display assembly.

Display assembly 540 includes a display panel 542 having an active display region 542a and a non-display region 542b. The non-display region 542b is an area that does not display output visible to a user during operation. Display panel 542 includes a front major surface 542c and a back major surface 542d. The front and back major surfaces 542c, 542d each include portions of active display region 542a and non-display region 542b. In some example embodiments, the active display region 542a includes an array of display pixels configured to generate a visible display, and the non-display region 542b at least partially surrounds active display region 542 at edges of display panel 542. In some embodiments, the display pixels may be associated with driving thin-film-transistors and switching thin-film-transistors of the TFT layer. In some embodiments, gate and data drivers are located in non-display region 542b.

Display assembly 540 may include a substrate 543, such as a cover layer, located over active display region 542a and/or non-display region 542b. Substrate 543 may include a color filter, polarizer, protective layer, or other substrate at least partially covering display panel 542. In some embodiments, display substrate 243 covers the entire active display region 542a of display panel 542.

Display panel 542 includes a bent portion that exhibits a curvature (e.g., a bent portion of non-display region 542b) and an extension portion 542f The bent portion includes a portion of display panel 542 that curves out of a plane of a portion of active display region 542a such that the bent portion is not co-planar with at least a portion of active display region 542a. In some example embodiments, the bent portion forms a bend of about 180° such that an end of the bent portion extends around one or more components of display assembly 540 such that the end is located behind one or more components of display assembly 540.

Display assembly 540 includes a sensor 571 located on extension portion 542f. Extension portion 542f may be a portion of display panel 542 extending outwardly beyond the bent portion (e.g. in the y-direction). For example, extension portion 542f may extend outwardly in a direction co-planar (e.g., substantially coplanar, within 10° of exactly coplanar) to a portion of active display region 542a of display panel 542. Extension portion 542f provides a substrate that can support sensor 571. Alternatively or additionally, extension portion 542f includes electrical conductors that facilitate electrical communication between sensor 571 and one or more components, such as flex conductor 550 in electrical communication with a circuit board of an electronic device. For example, the electrical conductors that provide electrical communication between sensor 571 and a circuit board of electronic device are routed through display panel 542, such as the TFT layer, a polyamide substrate layer, or a layer having touch sensing capability. In some embodiments, the electronic device does not include additional electrical conductors (e.g., external to display panel 542) used to provide communication between sensor 571 and flex conductor 550 or other component of the electronic device. The display panel 542 may provide the exclusive electrical communication between sensor 571 and flex conductor 550 or another component of electronic device 500.

Extension portion 542f and sensor 571 are located adjacent another component of electronic device 500 in a space-efficient configuration. For example, extension portion 542f and sensor 571 are located above a component 580 of electronic device housing 510. Component 580 may be a connector port, such as a USB port, configured to receive a complementary connector for power transfer, data transfer, etc. Alternatively or additionally, component 580 may include a proximity sensor, image sensor (e.g., of a camera assembly), microphone, speaker, accelerometer, flash device, processor, etc. Extension portion 542f may thus facilitate location of sensor 571 that is accessible by a user from the front surface of electronic device by stacking sensor 571 above component 580. In some example embodiments, sensor 571 is located entirely above component 580 such that no part of sensor 571 extends beyond a perimeter of component 580 or below the height of component 580.

In an example embodiment, sensor 571 located above component 580 facilitates one or more other components, such as an antenna, proximate sidewall 513 of electronic device housing 510. For example, sensor 571 and/or component 580 may have widths that are relatively smaller than a width of electronic device housing 510 such that sensor 571 and/or component 580 are not present along the entire width of electronic device housing 510. Electronic device 500 thus includes a space between sidewall 513 and display assembly 540 that can accommodate additional components, such as antennas. In some example embodiments, display assembly 540 including display panel 542 having an extension portion 542f can be accommodated in some existing electronic devices to provide a sensor 571, while requiring limited reconfiguration of an existing connector port or other components positioned proximate sidewall 513. Sensor 571 is accessible by a user and does not significantly interfere with the assembly or functioning of antenna components located between bottom wall 513 and other portions of display assembly 540, for example.

Sensor 571 may at least partially be accommodated within outer cover 541. Outer cover may be an outer glass layer that a user directly contacts when interacting with electronic device 500. Outer cover 541 may include a cut-out 541a that extends partially or completely through a material thickness of outer cover 541. The cut-out may allow sensor 571 to be located closer to the front surface of outer cover 541 such that a user may directly touch sensor 571, or such that less material thickness separates sensor 571 from a user's touch. In this way, the thickness of electronic device 500 (e.g., in the z-direction) can be reduced, while sensor 571 may be located in an ergonomically advantageous position.

Sensor 571 may be configured with a selected sensitivity to receive external input. In some example embodiments, sensor 571 is directly printed on extension portion 542f of display panel 542. A sensor 571 directly printed on display panel 542 may reduce the thickness of extension portion 542f and/or facilitate positioning underneath outer cover 541. Alternatively or additionally, sensor 571 may be a separate component that is electrically connected to electrical conductors of display assembly 542 (e.g., reflowed onto display panel 542). Such a configuration may facilitate positioning within cut-out 541a of outer cover 541 and/or locating sensor 571 closer to an outer surface of electronic device 500.

Figure 7:
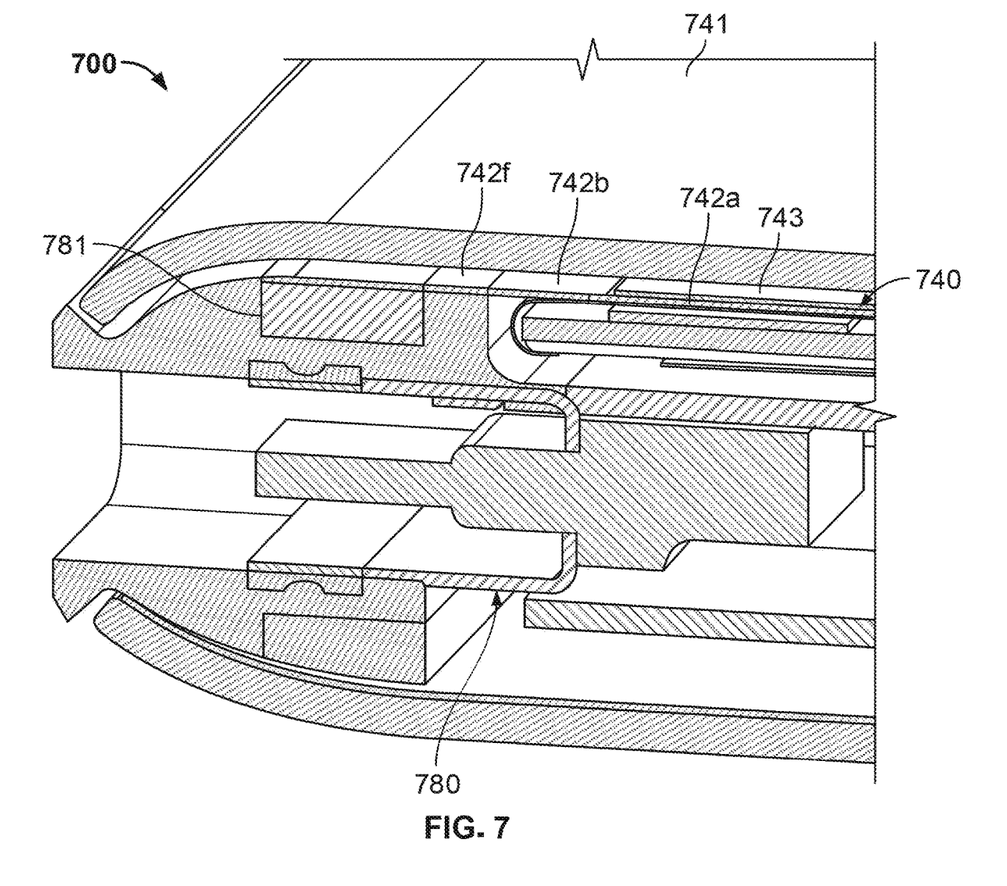
FIG. 7 is cross-sectional perspective view of another display assembly.

Referring to FIG. 7, an example electronic device 700 including display assembly 740 is shown. Display assembly 740 provides a display output and/or touch input for electronic device 700, and, in some embodiments, may have features similar to display assembly 140, display assembly 240, and/or display assembly 540, described above with reference to electronic devices 100, 200, 500 respectively. Display assembly 740 provides a space-efficient display that may reduce the presence of non-display border regions, and/or include electrical conductors that may connect a circuit board within an interior of electronic device 700 with a sensor, such as sensor 771, that may not typically communicate via a display assembly.

Display assembly 740 includes a display panel 742 having an active display region 742a and a non-display region 742b. In some example embodiments, the active display region 742a includes an array of display pixels configured to generate a visible display, and the non-display region 742b at least partially surrounds active display region 742 at edges of display panel 742. In some embodiments, the display pixels may be associated with driving thin-film-transistors and switching thin-film-transistors of the TFT layer. In some embodiments, gate and data drivers are located in non-display region 742b.

Display assembly 740 may include a substrate 743, such as a cover layer, located over active display region 742a and/or non-display region 742b. Substrate 743 may include a color filter, polarizer, protective layer, or other substrate at least partially covering display panel 742. In some embodiments, display substrate 743 covers the entire active display region 742a of display panel 742.

Display panel 742 includes a bent portion that exhibits a curvature (e.g., a bent portion of non-display region 752b) and an extension portion 742f The bent portion includes a portion of display panel 742 that curves out of a plane of a portion of active display region 742a such that the bent portion is not co-planar with at least a portion of active display region 742a. In some example embodiments, the bent portion forms a bend of about 180° such that an end of the bent portion extends around one or more components of display assembly 740 such that the end is located behind one or more components of display assembly 740.

Display assembly 740 includes a sensor 771 located on extension portion 742f. Extension portion 742f may be a portion of display panel 742 extending outwardly beyond the bent portion (e.g., in the y-direction). For example, extension portion 742f may extend outwardly in a direction co-planar (e.g., substantially coplanar, within 10° of exactly coplanar) to a portion of active display region 742a of display panel 742. Extension portion 742f provides a substrate that can support sensor 771. Alternatively or additionally, extension portion 742f includes electrical conductors that facilitate electrical communication between sensor 771 and one or more components, such as flex conductor 750 in electrical communication with a circuit board of an electronic device. For example, the electrical conductors that provide electrical communication between sensor 771 and a circuit board of electronic device are routed through display panel 742, such as the TFT layer, a polyamide substrate layer, or a layer having touch sensing capability. In some embodiments, the electronic device does not include additional electrical conductors (e.g., external to display panel 742) used to provide communication between sensor 771 and flex conductor 750 or other component of the electronic device. The display panel 742 may provide the exclusive electrical communication between sensor 771 and flex conductor 750 or another component of electronic device 700.

Extension portion 742*f* and sensor 771 are located proximate another component of electronic device 700 in a space-efficient configuration. For example, extension portion 742*f* and sensor 771 are located proximate component 780 of electronic device 700. Component 780 may be a connector port, such as a USB port, configured to receive a complementary connector for power transfer, data transfer, etc. Alternatively or additionally, component 780 may include a proximity sensor, image sensor (e.g., of a camera assembly), microphone, speaker, accelerometer, flash device, processor, etc. Extension portion 742*f* may thus facilitate location of sensor 771 that is accessible by a user from the front surface of electronic device by stacking extension portion 742*f* above component 780. In some example embodiments, sensor 771 is located entirely above component 780 such that no part of sensor 771 extends beyond a perimeter of component 780 or below the height of component 780. Alternatively or additionally, at least a portion of sensor 771 may be located below display panel 742 and/or accommodated within a recess of component 780. For example, a portion 771*a* of sensor 771 may be accommodated within recess 781 of component 780.

Sensor 571 may be accommodated entirely below outer cover 741. For example, outer cover 741 may have a substantially uniform thickness proximate sensor 771 such that sensor 771 is located below an interior surface of outer cover 741 (e.g., as opposed to being accommodated within a cut-out of outer cover 741). Sensor 771 may be printed directly extension portion 742*f* of display panel 742 or otherwise have a relatively thin profile. Alternatively or additionally, a portion of sensor 771 may be accommodated below extension portion 742*f* (e.g., within recess 781 of component 780).

Configurations in which sensor 771 is located below outer cover 741 can facilitate an electronic device 700 having a streamlined appearance with relatively fewer seams or joints, such as a seam between outer cover 741 and sensor 771. Alternatively or additionally, such configurations can facilitate efficient manufacturing and a mechanically robust electronic device by reducing the seams or joints to be sealed to prevent ingress of water, debris, etc.

In various implementations, the electrical conductor lines that pass through a bend in the display assembly and that connect a sensor to electrical components housed within an interior of the electronic device may pass through or between other layers of the display assembly. As one of many examples, the electrical lines may run through an adhesive layer or a polarizer layer, or between either of these layers and other layers.

Figure 8:
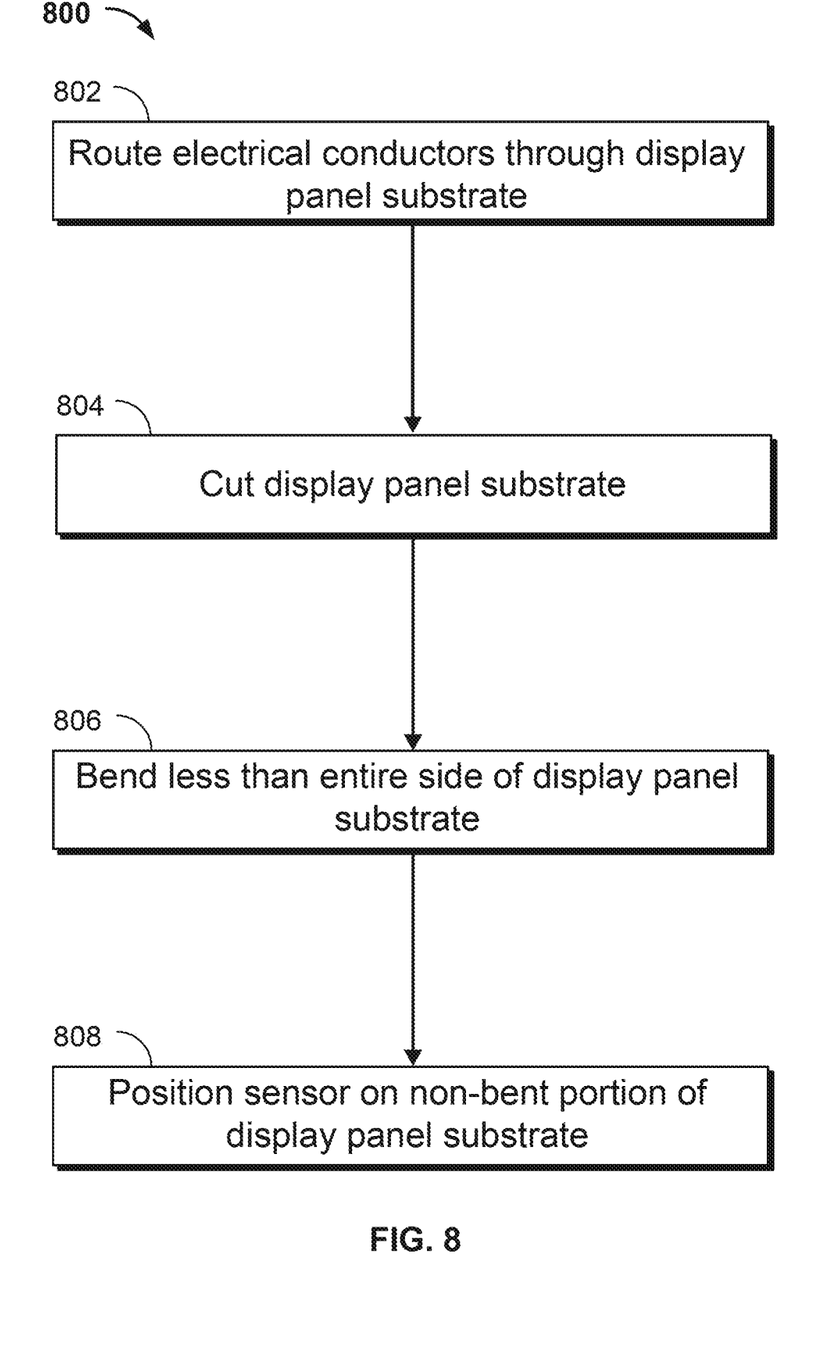
FIG. 8 is a flow diagram of a method of manufacturing an electronic device.

Some example electronic devices described herein facilitate efficient and reliable manufacturing techniques to provide a display assembly including electrical conductors that facilitate electrical communication of a fingerprint sensor or other component via the display panel. Referring to FIG. 8, a flow diagram of an example method 800 of manufacturing a display assembly is shown. In some embodiments, method 800 includes operation 802 of routing electrical conductors through a display panel substrate. The display panel substrate may be a TFT layer, polyamide layer, or a layer configured to have touch sensing capability within an assembled display assembly. The electrical conductors may be configured to transmit electrical signals output from a sensor, such as a fingerprint sensor, mounted to the display panel substrate.

Method 800 further includes operation 804 of cutting the display panel substrate. Operation 804 may include cutting an outer perimeter of the display panel substrate to a selected shape and dimensions, and/or cutting one or more slits in the display panel that allow portions of display panel to be selectively bent relative to other portions.

Method 800 further includes operation 806 of bending less than an entire side of the display panel substrate to form bent portions. For example, a first portion of display panel substrate may be bent to form bent portions, while another portion is not bent (e.g., to form an extension portion). The portion that is not bent thus may remain coplanar with a majority of the display panel substrate, while the bent portion is bent to be non-coplanar with the majority of the display panel substrate.

Method 808 further includes operation 808 of positioning a sensor on the extension portion of the display panel substrate. The sensor may be printed on the extension portion. Alternatively or additionally, the sensor may be a separately formed component that may be electrically connected with electrical conductors extending through the extension portion.

In various example embodiments, operations 802 to 808 may be performed in any sequence. For example, operation 808 of positioning the sensor may be performed first, before electrical conductors are routed through the display panel substrate. In some example embodiments, operation 804 of cutting the display panel substrate may be performed first, and other operations subsequently performed. The sequence of operations may be selected to facilitate efficient manufacturing and a robust display panel that can be assembly with other components of an electronic device.

While this specification contains many specific implementation details, these should not be construed as limitations on the scope of the disclosed technology or of what may be claimed, but rather as descriptions of features that may be specific to particular embodiments of particular disclosed technologies. Certain features that are described in this specification in the context of separate embodiments can also be implemented in combination in a single embodiment in part or in whole. Conversely, various features that are described in the context of a single embodiment can also be implemented in multiple embodiments separately or in any suitable subcombination. Moreover, although features may be described herein as acting in certain combinations and/or initially claimed as such, one or more features from a claimed combination can in some cases be excised from the combination, and the claimed combination may be directed to a subcombination or variation of a subcombination. Similarly, while operations may be described in a particular order, this should not be understood as requiring that such operations be performed in the particular order or in sequential order, or that all operations be performed, to achieve desirable results. Particular embodiments of the subject matter have been described. Other embodiments are within the scope of the following claims.

What is claimed is:

1. An electronic assembly, comprising:
   a display panel that includes:
      a front major face,
      a back major face that opposes the front major face,
      an active display region of the front major face, and
      a bent portion;
   a touch sensor device, the touch sensor adapted to receive touch input across the active display region of the display panel;
   a sensor electrically connected to the display panel at a sensor-connection location of the display panel, the sensor being distinct from the touch sensor device;
   a circuit board that includes a processor, the circuit board positioned behind the back major face of the display panel;
   a first electrical conductor positioned behind the back major face of the display panel and that electrically connects the bent portion of the display panel to the circuit board; and
   a second electrical conductor routed through the display panel that electrically connects the first electrical conductor to a third electrical conductor that provides the electrical connection between the sensor and the display panel at the sensor-connection location of the display panel.

2. The electronic assembly of claim 1, wherein the sensor comprises a fingerprint sensor.

3. The electronic assembly of claim 1, wherein the sensor comprises a proximity sensor.

4. The electronic assembly of claim 1, further comprising a cover glass that covers the display panel and the sensor.

5. The electronic assembly of claim 1, further comprising a port configured to removably receive an external connector, wherein:
   the external connector is to supply data or power from an external device, and
   the sensor is positioned between the port and a cover glass of the electronic assembly.

6. The electronic assembly of claim 1, wherein the bent portion comprises a first bent portion and a second bent portion, the first bent portion and the second bent portion being separately bendable.

7. The electronic assembly of claim 6, wherein:
   the display panel includes an extension portion,
   the extension portion is located between the first bent portion and the second bent portion, and
   the sensor is electrically connected to the extension portion of the display panel such that the extension portion of the display panel includes the sensor-connection location.

8. The electronic assembly of claim 7, wherein the display panel defines a central, longitudinal axis that is parallel to the front and back major faces, and the extension portion of the display panel is centered about the central, longitudinal axis.

9. The electronic assembly of claim 1, wherein:
   the display panel defines a central, longitudinal axis that is parallel to the front and back major faces,
   the bent portion comprises a first bent portion and a second bent portion, and
   the first bent portion is on an opposite side of the central, longitudinal axis from the second bent portion.

10. The electronic assembly of claim 1, wherein the display panel comprises a polyamide substrate having a plurality of electrical signal lines.

11. The electronic assembly of claim 1, wherein the display panel comprises a glass substrate comprising a plurality of electrical signal lines.

12. The electronic assembly of claim 1, wherein:
   the display panel includes an extension portion of the display panel,
   the sensor is electrically connected to the extension portion of the display panel such that the extension portion of the display panel includes the sensor-connection location, and
   the extension portion extends a greater distance from the active display region as compared to the bent portion.

13. The electronic assembly of claim 1, wherein:
   the display panel comprises an extension portion that extends beyond the active display region of the front major face, and
   the sensor-connection location is at a portion of the back major face that extends onto the extension portion of the display panel such that the sensor is positioned behind the back major face of the display panel.

14. The electronic assembly of claim 1, wherein the third electrical conductor comprises anisotropic conductive adhesive.

15. An electronic assembly, comprising:
   a display panel that includes:
      a front major face,
      a back major face that opposes the front major face,
      an active display region of the front major face, and
      a bent portion;
   a touch sensor device, the touch sensor adapted to receive touch input across the active display region of the display panel;
   a sensor connected to the display panel, the sensor being distinct from the touch sensor device;
   a circuit board that includes a processor, the circuit board positioned behind the back major face of the display panel;
   a first electrical conductor positioned behind the back major face of the display panel and that electrically connects the bent portion of the display panel to the circuit board; and
   a second electrical conductor that connects the sensor to the first electrical conductor via the bent portion of the display panel;
further comprising a port configured to removably receive an external connector, wherein:
   the external connector is to supply data or power from an external device,
   the sensor is positioned between the port and a cover glass of the electronic assembly, and
the port includes a USB port.

16. An electronic assembly, comprising:
   a display panel that includes:
      a front major face,
      a back major face that opposes the front major face,
      an active display region of the front major face, and
      a bent portion;
   a touch sensor device, the touch sensor adapted to receive touch input across the active display region of the display panel;
   a sensor electrically connected to the display panel at a sensor-connection location of the display panel, the sensor being distinct from the touch sensor device; and
   an electrical conductor that comprises a conductive line routed through the display panel through at least some of the bent portion of the display panel from the sensor-connection location of the display panel to a second location of the display panel.

17. The electronic assembly of claim 16, wherein the display panel includes an extension portion, the sensor connects to the extension portion of the display panel, and the extension portion extends a greater distance from the active display region as compared to the bent portion.

18. The electronic assembly of claim 17, wherein the bent portion comprises a first bent portion and a second bent portion, the first bent portion and the second bent portion being separately bendable, and wherein the extension portion of the display panel is located between the first bent portion and the second bent portion, the sensor electrically connected to the extension portion such that the extension portion of the display panel includes the sensor-connection location.

19. The electronic assembly of claim 18, further comprising a port configured to removably receive an external connector, wherein:
  the external connector is configured to supply data or power from an external device.

* * * * *

UNITED STATES PATENT AND TRADEMARK OFFICE
CERTIFICATE OF CORRECTION

PATENT NO. : 10,721,825 B2
APPLICATION NO. : 15/681042
DATED : July 21, 2020
INVENTOR(S) : Hassemer et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 38 days.

Signed and Sealed this
Second Day of November, 2021

Drew Hirshfeld
*Performing the Functions and Duties of the*
*Under Secretary of Commerce for Intellectual Property and*
*Director of the United States Patent and Trademark Office*